United States Patent [19]

Bretts et al.

[11] 4,189,618

[45] Feb. 19, 1980

[54] ELECTROMAGNETIC SHIELDING ENVELOPES FROM WOUND GLASSY METAL FILAMENTS

[75] Inventors: Gerald R. Bretts, Livingston; Dirk A. Timan; Gregory J. Sellers, both of Morristown; Wayne H. Witte, Martinsville, all of N.J.

[73] Assignee: Allied Chemical Corporation, Morris Township, Morris County, N.J.

[21] Appl. No.: 929,483

[22] Filed: Jul. 31, 1978

[51] Int. Cl.² .............. H05K 9/00; B65H 81/00; D03D 13/00
[52] U.S. Cl. .............. 174/35 MS; 156/173; 156/175; 313/313; 336/84 M; 428/36; 428/222
[58] Field of Search .............. 428/36, 222; 156/173, 156/175; 174/35 MS, 35 TS, 35 R; 313/313; 336/84 M

[56] References Cited

U.S. PATENT DOCUMENTS

| 3,018,321 | 1/1962 | Heckel et al. | 428/222 |
| 3,030,435 | 4/1962 | Andrews | 174/35 MS |
| 3,290,197 | 12/1966 | Carmody | 156/175 |
| 3,745,466 | 7/1973 | Pisano | 174/35 MS |
| 3,856,513 | 12/1974 | Chen et al. | 75/123 B |
| 4,071,834 | 1/1978 | Comte | 156/175 |

Primary Examiner—William R. Dixon, Jr.
Attorney, Agent, or Firm—Horst M. Kasper; Gerhard Fuchs

[57] ABSTRACT

Efficient electromagnetic shielding envelopes made of wound metallic glass filaments are disclosed. They are made by winding the filaments around a suitably shaped mandrel and embedding the filaments in a matrix. These shielding envelopes have high shielding ratios at low magnetic fields and are easily manufactured.

14 Claims, 9 Drawing Figures

ELECTROMAGNETIC SHIELDING ENVELOPES FROM WOUND GLASSY METAL FILAMENTS

FIELD OF THE INVENTION

The invention relates to the field of radiation shields, more specifically to the field of electromagnetic shields.

DESCRIPTION OF THE PRIOR ART

Electromagnetic shields are used for minimizing or reducing to substantially zero electromagnetic fields which may interfere with the operation of electrical and magnetic devices. For example, in color television receivers, the electron beam of the picture tube generally requires shielding from interference by D.C. magnetic fields created by the earth and by 60 Hz fields which are produced within the receiver by transformers and other electrical components. Similarly, the magnetic recording tape used in magnetic recording devices must also be shielded from stray fields.

Such shielding usually consists of punched and drawn stampings made of crystalline alloys, usually highly magnetically permeable alloys, for example, such as the 80/20 nickel-iron series (sold under the trademarks Mumetal, Hymu 80, Moly Permalloy), or the 50/50 nickel-iron series (sold under the trademarks 4750 Alloy, Hipernik). Where high saturation induction at moderate permeability is required, ingot iron or 3 percent silicon-iron is often employed. For example, for protecting instrumentation from the earth's magnetic field, shields fabricated from high permeability 80/20 nickel-iron alloy will reduce the field to less than one tenth of its original value (about 0.5 gauss in the U.S.A.). Such shields are good for low field applications. On the other hand, if it is desired to protect an aircraft compass system from the large magnetic stray fields (about 20 to 30 gauss) produced by devices containing permanent magnets, such as d'Arsonval ammeters and voltmeters, magnetrons, magnetic recorders, permanent magnet motors and the like, then ingot iron sheet or silicon-iron sheet with their higher saturation induction may be wrapped around the stray field source to absorb most of the stray flux. If additional shielding is desired, it is common practice to add a high permeability nickel-iron shield about ¼ inch away from the ingot iron to further reduce the field to extremely low values.

The shielding materials commonly employed in commercial practice suffer from several major drawbacks. First, all shielding alloys must be heat treated, usually in pure dry hydrogen, at temperatures above 800° C. to achieve optimum magnetic properties. Second, after this costly annealing, any slight bending strain will substantially lower the maximum permeability. Further, when these crystalline materials are formed into complex shapes, they must be reannealed at elevated temperatures to regain optimum magnetic properties. However, such reannealing does not permit maintenance of close dimensional tolerances. Moreover, in their final form, they are easily degraded by vibration, mechanical shock, or slight bending; even minor mishandling does substantially reduce their shielding effectiveness.

SUMMARY OF THE INVENTION

In accordance with the invention, electromagnetic shielding envelopes are provided, together with a process for making them. The electromagnetic shielding envelopes of the invention comprise wound filament of at least one metal alloy which is primarily glassy and has a maximum permeability of at least about 25,000, with the filaments being embedded in a matrix to hold the windings in place with respect to their relationship to each other.

The glassy metal alloy consists essentially of about 70 to 90 atom percent of at least one metal selected from the group consisting of iron and cobalt, up to about three-fourths of which may be replaced by nickel, and the balance at least one metalloid selected from the group consisting of boron, carbon and phosphorus, up to about three-fifths of which may be replaced by silicon and up to about one-third of which may be replaced by aluminum, plus incidental impurities.

The electromagnetic shielding envelopes of the present invention are made by winding a continuous metallic glass filament around a suitably shaped mandrel and embedding the windings within a matrix to hold them in place. Thereafter the mandrel may be withdrawn. Alternatively, the mandrel may be provided with an internal cavity within which the object to be shielded may be placed, and the mandrel may constitute part of the matrix.

The filament of glassy metal alloy is desirably a continuous filament, for ease of winding and to obtain optimum shielding performance. The filament has an aspect ratio (width to thickness) of greater than unity. It may also be referred to as "strip" or "ribbon". Such filament is obtained by rapidly quenching the glass-forming metal alloy at quench rates in excess of about $10^4$ to $10^{6°}$ C. per second by depositing the molten metal onto the surface of a rapidly moving chill body, as for example described by Hubert et al. [Zeitschrift fuer Metallkunde 64, 835–843 (1973)].

BRIEF DESCRIPTION OF THE DRAWINGS

The invention is further illustrated with reference to the annexed drawings, wherein.

DETAILED DESCRIPTION OF THE INVENTION

Figure 1:
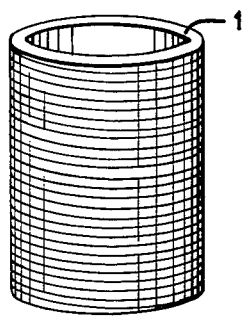
FIG. 1 is a perspective view of a cylindrical electromagnetic shielding envelope.

The glassy metal alloys employed in the invention consist essentially of about 70 to 90 atom percent of at least one metal selected from the group consisting of iron and cobalt, up to about three-fourths of which may be replaced by nickel, and the balance at least one metalloid selected from the group consisting of boron, carbon and phosphorus, up to about three-fifths of which may be replaced by silicon, and up to about one-third of which may be replaced by aluminum, plus incidental impurities. The partial replacement of iron and/or cobalt by nickel may result in higher permeability values. The partial replacement of the metalloid elements may be made in order to aid formation of the glassy filament during casting from the molten state and/or to improve its properties, including its magnetic properties.

The replacement by nickel of more than about three-fourths of the total amount of iron and/or cobalt tends to reduce the residual induction and hence the flux carrying capacity to unacceptably low levels. A preferred maximum replacement by nickel is about three-fifths of the total amount of iron and/or cobalt to maintain a reasonably high flux carrying capacity.

The glassy metal alloys employed in the invention include, without the partial replacement of metals and metalloids, compositions consisting essentially of about 70 to 90 atom percent of at least one of iron and cobalt and the balance at least one of boron, carbon and phosphorus. Examples include the following nominal compositions: $Fe_{80}B_{20}$, $Fe_{86}B_{14}$, $Co_{74}Fe_6B_{20}$, $Fe_{64}Co_{16}B_{20}$ and $Fe_{69}Co_{18}B_{13}$ (the subscripts are in atom percent. The glassy metal alloys employed in the invention also include, with maximum partial replacement of both metal and metalloid elements, compositions consisting essentially of about 19 to 22 atom percent of at least one of iron and cobalt, about 56 to 65 atom percent of nickel, about 9 to 17 atom percent of at least one of boron, carbon and phosphorus and about 4 to 8 atom percent of at least one of silicon and aluminum. Compositions intermediate the minimum and maximum replacement ranges, such as $Fe_{40}Ni_{40}P_{14}B_6$, $Ni_{50}Fe_{30}B_{20}$ and $Ni_{49}Fe_{29}P_{14}B_6Si_2$, are also included.

Up to about 10 atom percent of iron and/or cobalt may also be replaced by other transition metal elements which are commonly alloyed with iron and cobalt, without deleteriously affecting the desirable magnetic and mechanical properties of the glassy metal alloys employed in the invention. Such replacement may be made in order to obtain enhancement of specific properties, such as hardness, corrosion resistance and the like. Examples of such transition metal elements include chromium, molybdenum, copper, manganese, vanadium, niobium, tantalum and tungsten. Examples of glassy alloys suitably employed in the invention include the following nominal compositions: $Fe_{63}Co_{15}Mo_2B_{20}$, $Fe_{40}Ni_{38}Mo_4B_{18}$, $Fe_{17}Mo_9C_{18}B_2$, $Fe_{37}Ni_{37}Cr_4B_{22}$, $Fe_{67}Ni_{10}Cr_3B_{20}$, $Fe_{78}Mo_2B_{20}$, and $Fe_{40}Ni_{38}Mo_4B_{18}$. Cobalt-containing compositions of glassy alloys suitable for use in the shielding envelopes of the present invention include those having the formula $$Co_uFe_vNi_wB_z$$

wherein u is from about 40 to 80, v is from about 5 to 10, w is from about 10 to 30, and z is from about 15 to 20, all in atomic percent with the proviso that the sum of u+v+w+z equals 100.

It will be appreciated that the constituent elements of nominal compositions may be varied a few atom percent without substantial change in properties. The purity of all compositions is that found in normal commercial practice.

At a given field strength, the higher the permeability, the greater the effectiveness of a magnetic shield. A maximum permeability of at least about 25,000 is considered necessary to develop practically useful shielding. Preferably, the maximum permeability is at least about 100,000. Such values, which may be achieved by proper selection of alloy composition and/or by suitable processing of the electromagnetic shielding envelope, desirably increase the shielding ratio.

The term "glassy", as used herein, means a state of matter in which the component atoms are arranged in a disorderly array; that is, there is no long range order. Such a glassy material gives rise to broad, diffuse diffraction peaks when subjected to electromagnetic radiation having wavelengths in the X-ray region (about 0.01 to 50 Angstrom wavelength). This is in contrast to crystalline material, in which the component atoms are arranged in an orderly array, giving rise to sharp diffraction peaks. Primarily glassy material may include a minor amount of crystalline material. While the alloy is primarily glassy, it is preferred that it be substantially glassy in order to take advantage of the increasing ductility of the filaments with increasing degree of glassiness.

Glassy alloys such as $Fe_{40}Ni_{40}P_{14}B_6$ and $Fe_{80}B_{20}$ have the advantage that they develop their exceptionally high permeability as quenched during their processing. Details of the processing conditions and procedures to form glassy metal alloys are readily available; see, e.g. U.S. Pat. Nos. 3,856,513 and 3,845,805, issued Dec. 24, 1974 and issued Nov. 5, 1974, respectively.

Table I shows the remarkable shielding ratio performance of exemplary glassy alloys suitable for shielding purposes. Also shown in Table I are the improved properties of these glassy alloys resulting from field annealing. In Table I, $B_s(80)$ is the saturation induction at a field of 80 Oe, $u_{max}$ is the maximum permeability, and $H_c$ is the coercive force. These glassy alloys, which are conveniently processed according to the teachings of U.S. Pat. No. 3,856,513, in their as-quenched condition can be strained to appreciable stresses, such as to about 10,000 to 15,000 psi, without substantial loss in magnetic properties after the strain is removed. The iron-nickel alloy in Table I is particularly useful for low field applications (less than 2.5 Oersteds) where high permeability is desired. The iron alloy in Table I is most suited where high saturation together with high permeability is desired. While Table I gives two examples of alloys suitable in the practice of the invention, it will be appreciated that the other glassy alloys possessing at least the minimum magnetic properties described above are also suitable.

TABLE I

| Alloy Atom percent | $B_s(80)$, Gauss | $\mu_{max.}$ | $H_c$, Oersteds |
|---|---|---|---|
| $Fe_{40}Ni_{40}P_{14}B_6$ As-Quenched | 6,000 to 8,000 | 65,000 | 0.05 |
| $Fe_{40}Ni_{40}P_{14}B_6$ Field Annealed* | 7,700 | 800,000 | 0.007 |
| $Fe_{80}B_{20}$ As-Quenched | about 16,000 | up to about 102,000 | 0.08 |

TABLE I-continued

| Alloy Atom percent | $B_s(80)$, Gauss | $\mu_{max.}$ | $H_c$, Oersteds |
|---|---|---|---|
| $Fe_{80}B_{20}$ Field Annealed** | about 16,800 | 300,000 | 0.04 |

*Annealed at 325° C. for 2 hr. at 10 Oe in partial vacuum ($\approx 1000\mu m$)
**Annealed at 325° C. for 3 hr. at 10 Oe in partial vacuum ($\approx 1000\mu m$)

As previously stated, the electromagnetic shielding envelopes of the present invention are made by winding an appropriate metallic glass filament around a mandrel having the desired shape, embedding the windings in a suitable matrix and, optionally, withdrawing the mandrel. The electromagnetic shielding envelopes of the present invention may be rigid or flexible, depending on whether the matrix material is rigid or flexible. Fabrication of the shielding envelopes from the above-described metallic glass filaments has the advantage that the envelopes can be provided in flexible form, which is not possible if crystalline magnetic alloys, such as the above-described 80/20 or 50/50 nickel/iron alloys were employed, which lose their good magnetic properties on flexing. Use of a rigid matrix material results in shielding envelopes having substantially greater mechanical yield strength than that of shields fabricated from annealed crystalline alloys.

A suitable method of fabrication might involve rotation of the mandrel around an axis, and feeding the metallic glass filament to the mandrel to wind it around it. The metallic glass filament should be wound around the mandrel desirably such that an even coverage is obtained of at least about 60 percent of the surface of mandrel, preferably at least about 85 percent, and more preferably yet about substantially complete coverage of the surface of the mandrel. In order to enhance shielding performance still further, several overlapping layers of metallic glass filament may be wound round the mandrel, say about 1 to about 30 layers, there being little shielding improvement obtained by employing more than about 30 layers. The wound filaments on their own, without further support, would not form an envelope having sufficient intrinsic strength to keep the windings together. For that reason, a supporting matrix is provided. The supporting matrix may provide one-sided support or may provide support throughout the envelope. For example, the metallic glass filament may be wound around a cylindrical metal or plastic tube and the beginning and the end of the filament are suitably affixed to the plastic tube to prevent unraveling of the windings. Thereafter, an encapsulating matrix may be applied, as by applying a coating of a liquid curable to the solid state, as by dipping or spraying, followed by curing of the coating. The shielding envelope so obtained including the mandrel is suitable for placement around the object to be shielding against electromagnetic radiation, or around an object emitting electromagnetic radiation. Alternatively, the mandrel may be withdrawn following cure of the coating. In that event, a suitable mold release agent, of which there are numerous known to those skilled in the art, is desirably applied to the exterior surface of the mandrel prior to the winding operation to facilitate withdrawal of the mandrel.

It is also possible to hold together the windings of the envelope by application of "sticky" adhesive tape, which may be wound over the exterior of the formed envelope while it is still being held on the mandrel, or the tape may be applied to the exterior surface of the mandrel, and the glassy metal filament may be wound onto the sticky surface of the adhesive tape. For purposes of the present invention, metallic glass filament in wound envelope form wrapped in or covered on at least one side by such adhesive tape shall be considered "embedded" in a matrix.

Preferably, however, the wound metallic glass filament is embedded in a suitable liquid adhesive curable to the solid state. Cure to the solid state may be effected by evaporation of the solvent from the liquid, polymerization of liquid resin, as well as solidification from the melt, and the like. Suitable adhesive materials, of which there are many known to those skilled in the art, include organic plastic materials such as resins and polymers. Preferred plastics include silicone resins, epoxidized and epoxy resins, polyvinyl chloride, phenolic resins, polyamides, polyethers, polysulfones and polyesters. Also included are phenol formaldehyde epoxy resins, and resin blends such as phenolic/vinyl blends, phenolic/polyvinyl butyral, phenolic/polyvinyl formal, phenolic-butadiene-acrylonitrile rubber, polyvinyl acetate-phenolic resin, neoprene rubber/phenolic resin, nitrile rubber/phenolic resin, and the like. These resins may be applied from their solutions in suitable organic solvents, or from their dispersion in aqueous media or organic swelling agents, as is well known to those skilled in the art. The resins may be further modified by inclusion of fillers, modifiers, accelerators, curing agents, wetting agents, blocking agents, diluents, antioxidants, and the like.

Following application, the liquid adhesive material is cured to form the solid matrix. Cure can be effected by processes such as drying, polymerization, plasticizer absorption, solidification from a hot melt, or evaporation of dispersant. The type of cure is not critical—provided the curing conditions are compatible with the metallic glass, that is to say, they would not adversely affect its desirable properties in a material way—and combination of curing methods can be employed depending on the type of resin formulation.

Methods for applying the liquid curable adhesive composition to the wound metallic glass filament include dipping, brush or roller coating, spraying and the like. Also, injection molding of a matrix around a wound core is a suitable method for forming a matrix. It is a particular advantage of the envelopes of the present invention that, while the matrix material is still formable, these envelopes can be molded to precisely controlled dimensions, so that envelopes can be provided having critically controlled, closed dimensions, which is not possible with shielding envelopes constructed of the crystalline magnetic shielding alloys of the prior art.

As stated above, the electromagnetic shielding envelopes of the present invention retain their outstanding magnetic characteristics even after being strained within the limits of the bonding strength.

While the as-cast glassy alloy filaments are useful in their processed condition, further processing such as annealing, which includes heat treating in air, inert gas or in a vacuum with or without concurrent application of a magnetic field, results in substantial improvement of these properties.

While the filaments themselves may be so annealed, it is preferred that the completed envelope be annealed. Therefore, if the envelop is to be thermally annealed, then it is necessary that the matrix material is stable up to such annealing temperatures. Typically, such heat treating is done at temperatures sufficiently high so as to result in atomic rearrangement and relieve strain within a reasonably finite period of time, yet sufficiently below the temperature at which the glassy alloy begins to crystallize so as to avoid formation of undesirable crystallization phases which tend to be brittle as well as magnetically undesirable. Desirably, such heat treatment is conducted at temperatures above the Curie temperature yet still below the crystallization temperature. The Curie temperature and the crystallization are unique for each metallic glass, and the temperature at which stress relief is obtained, which is one objective of the heat treatment operation, also depends on the type of metallic glass involved as well as its processing history. Desirably, heat treatment is conducted at temperature at least about 25° C. above the Curie temperature, but at least about 15° C. below the crystallization temperature. Annealing times may be from about one second to about 10 hours, preferably up to about 3 hours, or less.

Where filaments of two different glassy metal alloys are employed, as is within the scope of the present invention, then the annealing temperature selected should desirably be above the Curie temperature of the glassy alloy having the higher Curie temperature and below the crystallization temperature of the glassy alloy having the lower crystallization temperature. In cases where these values overlap, judicious selection of the annealing temperature must be made to attain the maximum improvement in magnetic properties possible, desirably consistent with avoiding crystallization of glassy phases.

Figure 9:
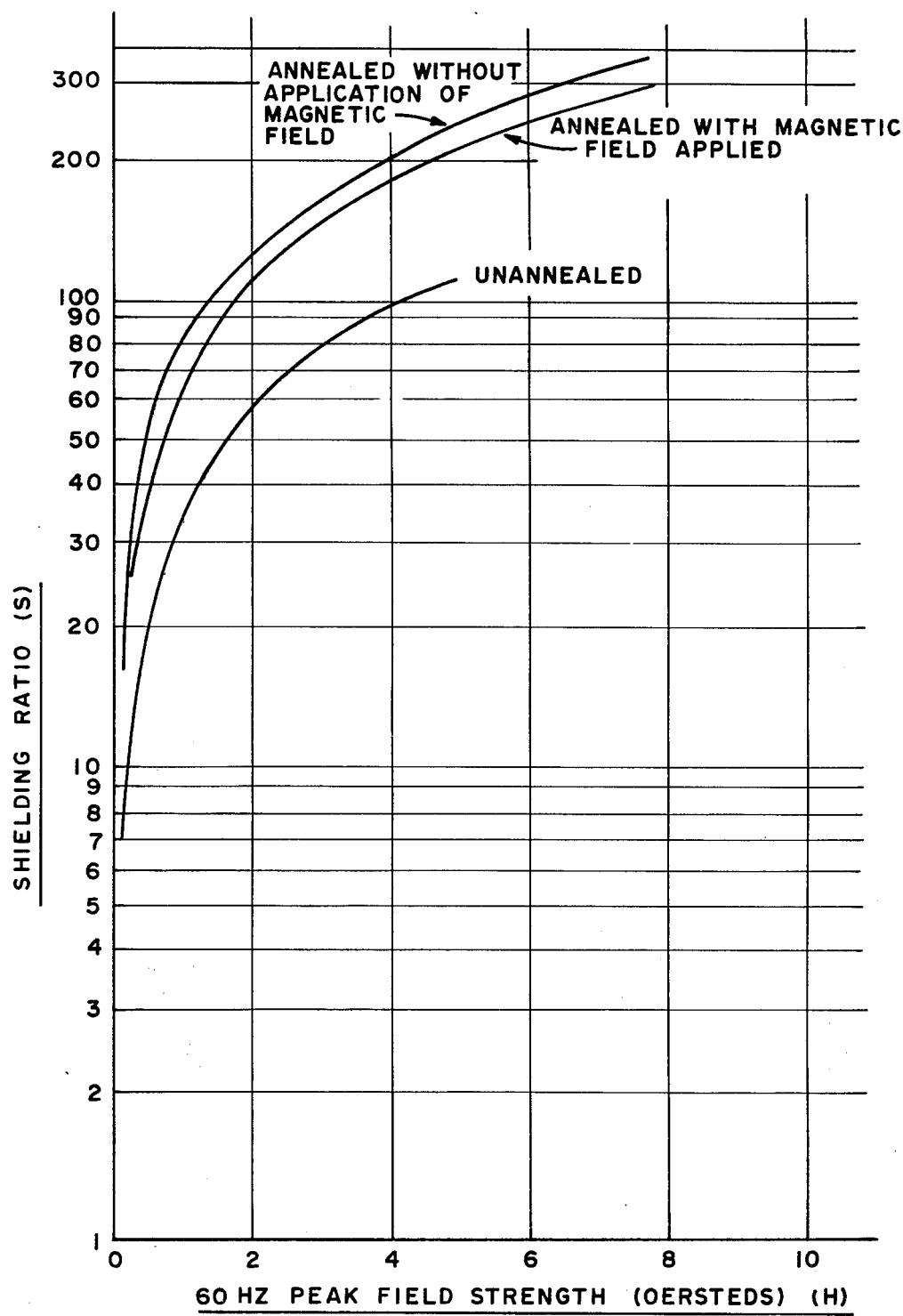
FIG. 9 is a diagram showing the comparative shielding ratio (S) on the ordinate versus applied field strength (H) for cylindrical electromagnetic shielding envelopes of $Fe_{40}Ni_{40}P_{14}B_6$ after annealing in the absence and in the presence of an applied magnetic field.

Following the anneal, a slow cooling of about 1° to 30° C./min is desirably employed to cool the material to ambient temperature, although somewhat higher rates may also be employed. A magnetic field may optionally be applied during annealing to induce magnetic anisotrophy. Such field is usually applied to the glassy alloy during cooling as the temperature approaches the Curie temperature and is usually maintained until the temperature of the glassy alloy is well below the Curie temperature, say at least about 100° C. below the Curie temperature. The magnitude of the applied magnetic field is not critical; however, fields of about 1 to 10 Oe are usually sufficient to create the desired effect. However, contrary to expectations, it has been surprisingly found that annealing of the shielding envelopes of the present invention in the absence of an applied magnetic field is at least as effective in improving the shielding ratio as annealing in the presence of an applied field. The reasons therefor are not understood. FIG. 9 of the drawings demonstrates comparative shielding ratio curves at 60 HZ Peak Field Strength (Oersteds) on identical cylindrical shielding envelopes which are (1) unannealed, (2) annealed at 325° C. for 2 hrs. in the absence of an applied magnetic field, and (3) annealed at 325° C. for 2 hrs. in the presence of an applied magnetic field of 10 Oersteds D.C. maintained circumferential of the envelopes.

Also, the glassy alloy filament can be plated, such as with copper, tin or brass, to improve bonding to the matrix and to obtain higher frequency characteristics for eddy current shielding. The plating may be by electro or electroless deposition, vapor deposition or other similar well-known techniques. The filaments themselves may be plated before winding into an envelope or, alternatively, the wound filament may be plated prior to embedment in the matrix. A thickness of about 30 to 10,000 Angstroms is usually sufficient to provide the desired high frequency shielding.

Figure 7:
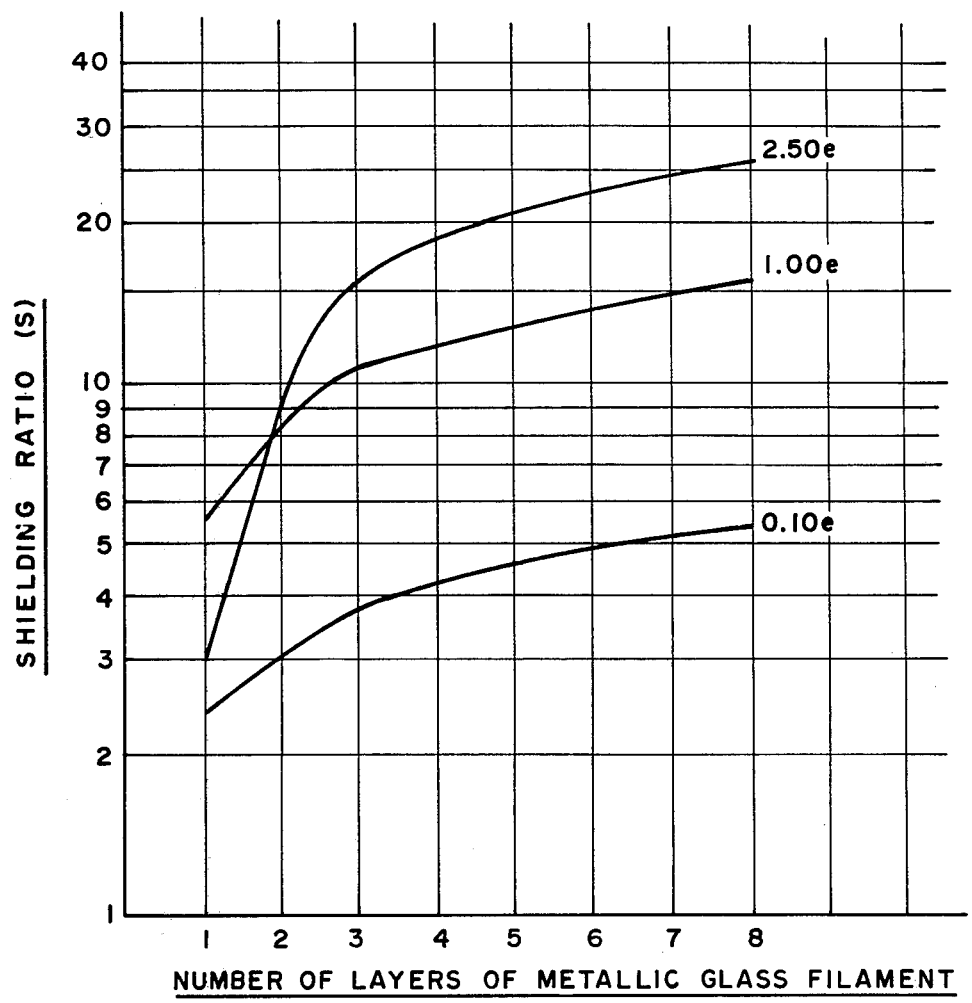
FIG. 7 is a diagram showing the shielding ratio (S) on the ordinate versus applied field strength (H) for cylindrical electromatic shielding envelopes of $Fe_{40}Ni_{40}P_{14}B_6$ alloy employing 1 through 8 layers of metallic glass filament.

As previously stated, the filament should be wound around the mandrel to provide at least about 60 percent, preferably at least about 85 percent, coverage of the surface of the mandrel. Desirable, 100 percent coverage is employed. It has further been found that the magnetic shielding performance of the electromagnetic shielding envelopes of the present invention is substantially improved by using multiple layers of wound filament. FIG. 7 shows comparative shielding ratios (as hereinbelow defined) of cylindrical electromagnetic shielding envelopes of 2-inch internal diameter and 8-inch length wound from 1 inch wide metallic glass filament of composition $Fe_{40}Ni_{40}P_{14}B_6$ (atomic percent), at 60 Hertz peak field strength of 2.5, 1.0 and 0.1 Oersteds for 1 through 8 layers of filament.

Figure 8:
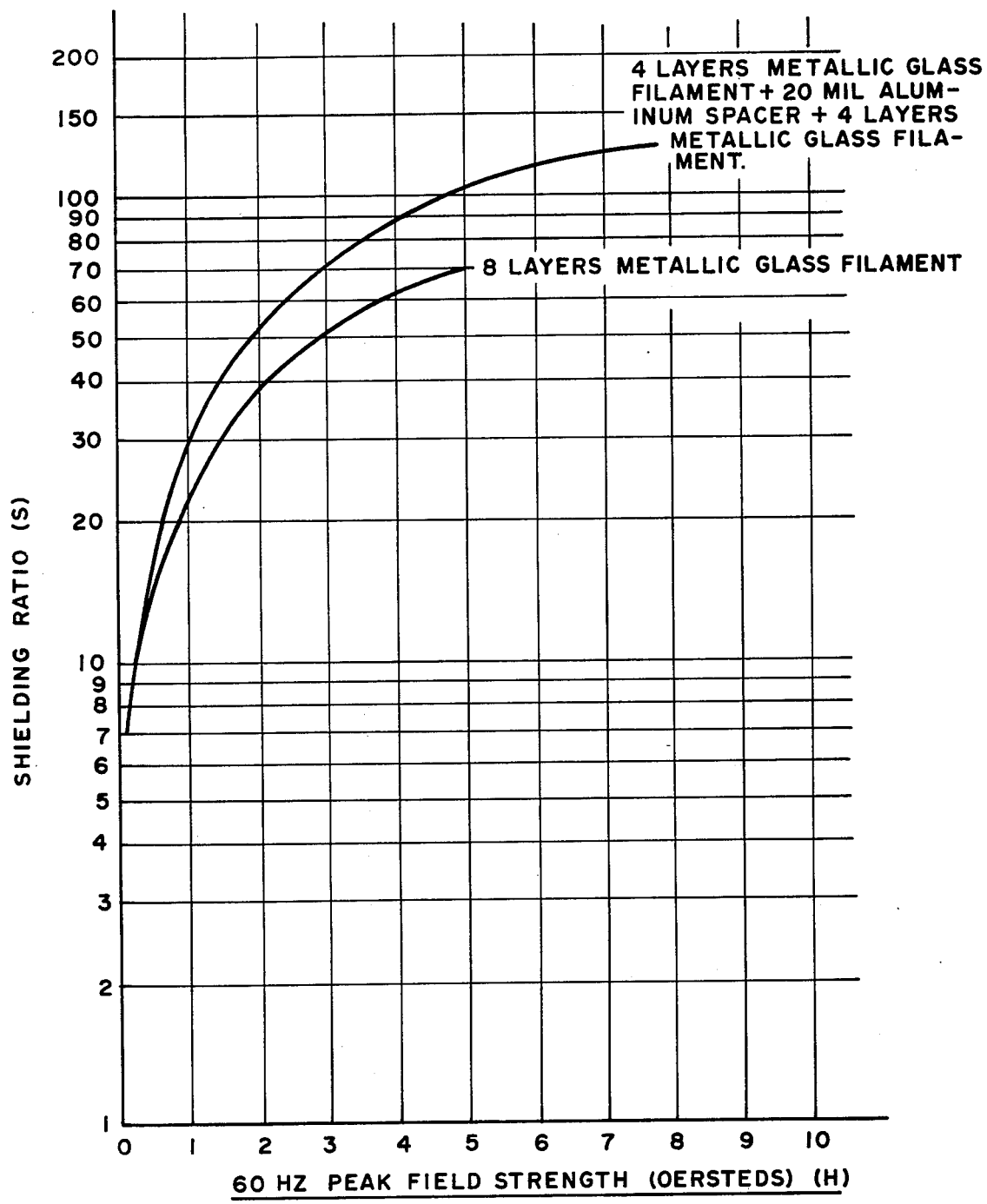
FIG. 8 is a diagram showing comparative shielding ratios (S) on the ordinate versus applied field strength (H) for cylindrical electromagnetic shielding envelopes of $Fe_{40}Ni_{40}P_{14}B_6$ alloy constructed of multiple layers of metallic glass filament, with and without interposed non-magnetic spacers.

It has furthermore been found that the magnetic shielding performance of electromagnetic shielding envelopes of the present invention is substantially improved by providing multiple layers of filament which are spaced apart from each other by means of nonmagnetic spacers. Such spacers include nonmagnetic conductors such as copper, nickel and aluminum, or electrical insulators. Indeed, the matrix material employed for making the envelopes of the present invention may be suitably employed as spacer. Spacers may be employed in thickness of, say, at least about 1 mil between layers of wound filament, there being no upper limit on the spacing which may be provided between the layers of wound filament, the only limitation being the practical limitation of space and size of the equipment. FIG. 8 shows comparative shielding ratios (as herein-below defined) of two cylindrical shielding envelopes of the present invention fabricated from eight layers of ½ inch wide metallic glass filament having composition $Fe_{40}Ni_{40}P_{14}B_6$, wherein in the first cylinder the layers of metallic glass ribbon are wound directly upon each other, and wherein the second cylinder comprises four layers of the same metallic glass filament wound upon each other, followed by a twenty mil aluminum foil spacer, which in turn is followed by four more layers wound upon each other of the same metallic glass filament. Similar improvements in shielding ratio are obtained when electrical insulating materials are substituted for the aluminum as spacing material.

Figure 2:
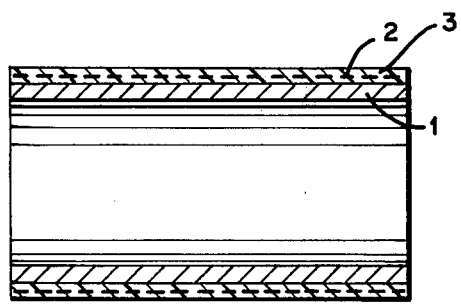
FIG. 2 is a longitudinal cross-sectional view of the envelope of FIG. 1.

Referring now to FIGS. 1 through 6 of the drawings in more detail, there is shown in FIG. 1 a cylindrical electromagnetic shielding envelope in accordance with the present invention, comprising an inner tube 1 of a nonmagnetic material (e.g. a plastic material, an electric conductor or an electrically conductive nonmagnetic metal such as nickel, copper or aluminum) carrying on its exterior surface a helically wound single layer of metallic glass filament. FIG. 2 shows a longitudinal cross-section of the cylindrical envelope of FIG. 1 showing in cross-section the metallic glass filament 2, which is helically wound around inner tube 1 and which is embedded in the matrix 3. Cylindrical envelopes of the type illustrated by FIGS. 1 and 2 may be simply constructed by rotating tube 1 around its longitudinal axis, applying a coat of a liquid matrix material curable to the solid state, e.g. a curable epoxy resin formulation to its surface, then winding the metallic glass filament around the coated tube, followed by applying a final coat of the curable matrix material and cure of the matrix to the solid state. Such cylindrical envelopes can be constructed in any desired diameter and any desired length, and are suitable for use in many applications.

Figure 3:
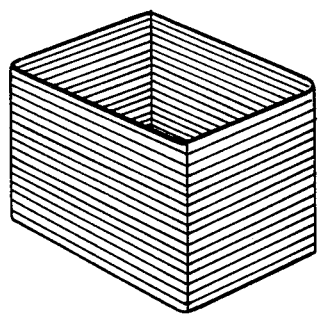
FIGS. 3, 4 and 5 respectively represent perspective views of a cubic electromagnetic shielding envelope, of a flat envelope and of an envelope for shielding a cathode ray tube.

FIG. 3 represents a cubic box-type envelope enclosed on five sides, (may also be enclosed on all six sides) constructed by winding metallic filament in the manner described in connection with the cylindrical envelope illustrated by FIG. 1, and then, after the matrix is cured to the solid state, withdrawing the mandrel.

Figure 4:
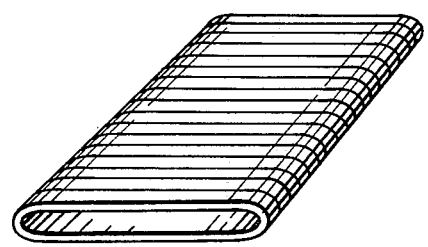

FIG. 4 illustrates a flat envelope, particularly suited for shielding essentially flat, two dimensional objects, such as magnetic bubble memories.

Figure 5:
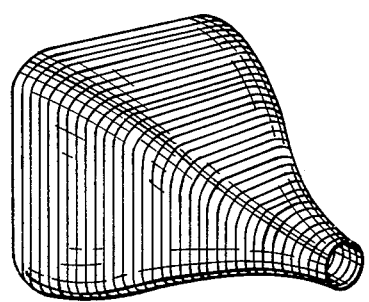

FIG. 5 illustrates an envelope which has been obtained by winding metallic glass filament around a suitably shaped mandrel having the contours of a cathode ray tube.

Figure 6:
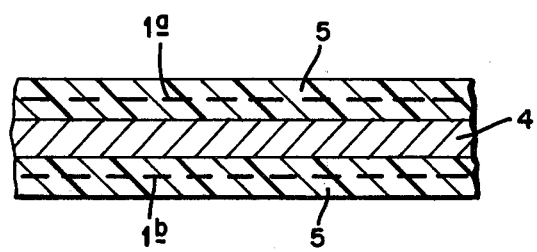
FIG. 6 is a cross-sectional view of a shielding envelope wherein two overlapping windings of the metallic glass filament are embedded in a matrix, and are spaced apart by a non-magnetic spacer.

FIG. 6 provides a substantially enlarged view of a cross-section of a wall of an envelope in accordance with the present invention wherein two layers of wound metallic glass filament 1a and 1b are spaced apart by means of a nonmagnetic, electrically conductive spacer 4 (e.g. aluminum foil), all embedded in cured nonmagnetic, nonconductive matrix material 5.

Further details of construction and of methods for making the electromagnetic shielding envelopes comprising wound metallic glass filament will be obvious to those skilled in the pertinent art.

In the Examples set forth below, test procedure A698-74 of the American Society for Testing Materials entitled "Magnetic Shield Efficiency In Attenuating Alternating Magnetic Fields" was followed in evaluating the shields. With this technique 60 Hz AC current passes through 48-inch diameter Helmholtz coils to produce a varying magnetic field. A Krohn-Hite model 4200A oscillator signaled a Crown Model M-600 power amplifier to provide the 60 Hz AC current which was monitored with a Dana Model 4600 digital multimeter and a Hewlett-Packard Model 5300B frequency meter. A Hewlett-Packard model 400F AC voltmeter, a Princeton Applied Research model 113 Pre-Amp and a Tektronix model 7613 oscilloscope completed the measuring equipment.

The Helmholtz coil was calibrated by measuring the field at its center with no shields present ($H_p$). The Helmholtz coils produced a magnetic field of 1.0 peak Oersted per rms ampere flowing through them in series. From the current flowing through the coils, the value of $H_p$ in Oersteds was determined. This 60 Hz alternating magnetic field induced a voltage in a pick-up coil. The voltage with no test envelope present was also recorded and was called $E_1$. $H_p$ was proportional to $E_l$. A test envelope was inserted into the Helmholtz pair so that it surrounded the pick-up coil. With the test envelope in place, a voltage $E_2$, which was attenuated below $E_1$, was measured. The voltage $E_2$ was a measure of the field strength inside the test envelope, $H_{in}$. By definition, the ratio of $E_1/E_2$ is the shielding ratio also called the attenuation ratio.

EXAMPLE 1

Cylindrical test envelopes, 8 inches long with 2 inch inner diameter were prepared by helically winding ribbon over plastic or glass tubes. All test cylinders had one layer of ribbon with the ribbons placed tightly side by side. The wound ribbon was secured with silicone-coated KAPTON (T.M.) or 3M Magic Brand (T.M.) adhesive tape.

Measurements of magnetic shielding performance were made at 60 Hz using the standard Helmholtz Test (ASTM A698-74). The reported data represent values taken at the center of each tube with the magnetic field perpendicular to the axis of the cylinder.

Table II, below, shows the magnetic shielding performance versus applied field strength for several alloys.

TABLE II

| (Oe) | SHIELDING RATIO PERFORMANCES | | | | |
|---|---|---|---|---|---|
| | $Ni_{40}Fe_{40}P_{14}B_6$ | $Fe_{42}N_{38}P_{13}B_7$ | $Co_{45}Ni_{25}Fe_{10}B_{20}$ | $Co_{55}Ni_{15}Fe_{10}B_{20}$ | $Co_{74}Fe_6B_{20}$ |
| H FIELD (Oe) | | | | | |
| 0.10 | 4.07 | 3.77 | 4.70 | 4.51 | 4.72 |
| 0.25 | 7.46 | 6.74 | 9.08 | 8.33 | 8.05 |
| 0.50 | 11.7 | 10.7 | 14.7 | 13.7 | 10.9 |
| 1.0 | 20.3 | 18.2 | 24.3 | 22.4 | 14.3 |
| 2.0 | 35.9 | 33.2 | 41.6 | 37.9 | 17.8 |
| 2.5 | 42.9 | 40.4 | 46.7 | 44.4 | 18.4 |
| 5.0 | 10.1 | 38.7 | 6.00 | 70.1 | 15.2 |
| 8.0 | 3.00 | 4.11 | 2.49 | 5.75 | 3.30 |
| RIBBON | | | | | |
| Width (mils) | 73.0 | 73.0 | 83.2 | 71.5 | 26.0 |
| Thickness (mils) | 2.3 | 2.3 | 1.8 | 1.7 | 0.8 |

EXAMPLE 2

Cylindrical test envelopes 8 inches long with 2 inch diameter, were prepared with multiple layers of helically wound ribbon. Shields with one to eight layers of $Ni_{40}Fe_{40}P_{14}B_6$ were prepared by tightly winding each layer of ribbons tightly side by side. Each layer was secured with silicone coated KAPTAN Brand (T.M.) or 3M Magic (T.M.) adhesive tape.

Measurement of magnetic shielding performance were made at 60 Hz using the ASTM A698-74 procedure. The reported data represent values measured at the center of each tube with the magnetic field cylindrical to the axis of the cylinder.

FIG. 7 shows the magnetic field performance versus the number of layers for applied field strengths of 0.1, 1.0 and 2.5 Oersteds.

EXAMPLE 3

A cylindrical test envelope 8 inches long with 2 inch diameter was prepared by first helically winding 4 layers of $Ni_{40}Fe_{40}P_{14}B_6$ ribbon as described in Example 2, then overwrapping with aluminum foil until a thickness of 20 mils was added followed by an additional 4 layers of ribbon. This hybrid therefore consisted of concentric cylinders of the glassy metal ribbon separated by a 20 mil spacer of aluminum foil.

Measurements were made as described in Examples 1 and 2. FIG. 8 shows the magnetic shielding performance versus 60 Hz applied field strength for this composite in comparison to a shield made of 8 layers of ribbon without spacer.

EXAMPLE 4

Two cylindrical test envelopes 7 inches long with 2 inch diameter consisting of 8 layers of helically wound ribbon were prepared as described in Example 2. Subsequent to fabrication, one envelope was subjected to a simple thermal anneal of 325° C. for 2 hours in a flowing argon atmosphere, a second envelope was subjected to a field anneal at 325° C. for 2 hours in a flowing argon atmosphere with an applied D.C. field of 10 Oe in the circumferential direction. This field was maintained while the sample cooled to room temperature.

Measurements were made as in Example 1. FIG. 9 shows the magnetic shielding performance versus applied field strength for each of these samples.

EXAMPLE 5

Cylindrical test envelopes 11 inches long by 3 inch I.D., and 7 inches long by 2-3/16 inch I.D. were fabricated by helically winding ribbon tightly side-by-side on a mandrel coated with mold release. In each case, four separate layers of metallic glassy ribbon $Ni_{40}Fe_{40}P_{14}B_6$, were secured with a thin coating of quick curing epoxy. After completing all four metal layers and allowing the final epoxy coating to completely cure, the cylinder was slipped off the construction mandrel.

When tested as in Example 1, these envelopes showed the magnetic shielding performance listed in Table III, below.

TABLE III

|  | SR* at 1.0 Oersted of 60 Hz Field | SR at 2.5 Oersted of 60 Hz Field |
|---|---|---|
| 11" L × 3" I.D. |  |  |
| 70 mil ribbon | 33 | 62 |
| ½ inch ribbon | 25 | 38 |
| 7" L × 2 3/16" I.D. |  |  |
| 70 mil | 29 | 52 |
| ½ inch | 27 | 48 |

*Shielding ratio

Since various changes and modifications may be made in the invention without departing from its spirit and essential characteristics, it is intended that all matter contained in the description shall be interpreted as illustrative and not in a limiting sense, the scope of the invention being defined by the appended claims.

We claim:

1. An electromagnetic shielding envelope comprising a shell of a wound metallic glass filament which is primarily glassy and has a maximum permeability of at least about 25,000, said filament being embedded in a matrix.

2. The envelope of claim 1 wherein the metallic glass filament consists essentially of about 70 to 90 atom percent of at least one metal selected from the group consisting of iron and cobalt, up to about ¾ of which may be replaced by nickel, and the balance at least one metalloid selected from the group consisting of boron, carbon and phosphorus, up to about 3/5 of which may be replaced by silicon, and up to about ⅓ of which may be replaced by aluminum, plus incidental impurities.

3. The envelope of claim 2 wherein the metallic glass filament provides at least about 60 percent coverage of the area of the envelope.

4. The envelope of claim 2 employing up to about 30 layers of wound metallic glass filament.

5. The envelope of claim 2 employing at least two layers of metallic glass filament, which are spaced apart by means of a nonmagnetic spacer.

6. The envelope of claim 5 wherein the spacer is an electrical insulator.

7. The envelope of claim 5 wherein the spacer is an electrical conductor.

8. The envelope of claim 2 in form of a cylindrical shell wherein the metallic glass filament is helically wound.

9. The envelope of claim 8 wherein the helically wound metallic glass filament is embedded in a flexible matrix.

10. The envelope of claim 9 wherein the helically wound metallic glass filament is embedded in a rigid matrix.

11. The method for making electromagnetic shielding envelopes of claim 1 which comprises winding a metallic glass filament which is primarily glassy and has a maximum permeability of at least about 25,000 around a mandrel having the desired shape of the envelope, applying a liquid resin composition curable to the solid state to the wound filament to embed the filament therein, followed by curing the resin composition to the solid state and withdrawing the mandrel.

12. The method of claim 11 wherein the metallic glass filament is wound around the mandrel to obtain even coverage of at least about 60 percent of the surface of the mandrel.

13. The method of claim 11 wherein the envelope is subjected to thermal annealing at temperature above the Curie temperature but below the crystallization temperature of the metallic glass.

14. The method of claim 13 wherein the envelope is subjected to thermal annealing at temperature at least about 25° C. above the Curie temperature but at least about 15° below the crystallization temperature of the metallic glass for time period of between about 1 second and about 10 hours.

* * * * *